US008810461B2

(12) United States Patent
Roth et al.

(10) Patent No.: US 8,810,461 B2
(45) Date of Patent: Aug. 19, 2014

(54) ANTENNA COUPLER

(75) Inventors: Martin Roth, Starnberg (DE); Gottfried Holzmann, Zorneding (DE); Andreas Schiessl, Neunburg (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 1009 days.

(21) Appl. No.: 12/809,250

(22) PCT Filed: Dec. 17, 2008

(86) PCT No.: PCT/EP2008/010757

§ 371 (c)(1),
(2), (4) Date: Jun. 18, 2010

(87) PCT Pub. No.: WO2009/077171

PCT Pub. Date: Jun. 25, 2009

(65) Prior Publication Data

US 2010/0271267 A1 Oct. 28, 2010

(30) Foreign Application Priority Data

Dec. 18, 2007 (EP) .................................... 07024557
Apr. 25, 2008 (EP) .................................... 08008065

(51) Int. Cl.
*G01R 29/10* (2006.01)
*H01Q 13/10* (2006.01)
*H01Q 1/36* (2006.01)

(52) U.S. Cl.
USPC ............................ 343/703; 343/767; 343/895

(58) Field of Classification Search
USPC ................................. 343/767, 770, 895, 703
See application file for complete search history.

(56) References Cited

U.S. PATENT DOCUMENTS 4,652,889 A 3/1987 Bizouard et al.
5,053,786 A * 10/1991 Silverman et al. ............ 343/895
5,227,807 A 7/1993 Bohlman et al.
5,274,390 A 12/1993 Breakall
5,815,122 A * 9/1998 Nurnberger et al. .......... 343/767
6,384,789 B2 * 5/2002 Hofmann ...................... 343/702
6,791,497 B2 * 9/2004 Winebrand et al. ........... 343/702
7,142,821 B1 11/2006 Mohuchy et al.

FOREIGN PATENT DOCUMENTS

DE 197 32 639 C1 1/1999
DE 10 2004 033 383 A1 11/2005

(Continued)

OTHER PUBLICATIONS

International Search Report, PCT/EP2008/010757, Mar. 4, 2009, pp. 32-41.

(Continued)

*Primary Examiner* — Robert Karacsony
(74) *Attorney, Agent, or Firm* — Ditthavong & Steiner, P.C.

(57) ABSTRACT

An antenna coupler for testing a mobile-radio device with a coupling element formed in a flat manner by strip conductors on a printed-circuit board and with a retaining device formed on a first side of the printed-circuit board for positioning a mobile-radio device in the vicinity of the coupling element. On the first side of the printed-circuit board, at least one slit structure is introduced into an ground metallization formed there. For feeding the slit structure serving as the coupling element, at least one stripline formed on the second side facing away from it forms a microstripline with the ground metallization remaining between the slit structure of the first side.

14 Claims, 9 Drawing Sheets

(56) References Cited

FOREIGN PATENT DOCUMENTS

| | | | |
|---|---|---|---|
| EP | 1 619 748 | A1 | 1/2006 |
| GB | 1148320 | | 4/1969 |
| GB | 2 324 657 | A | 10/1998 |
| JP | 8-56112 | A | 2/1996 |
| WO | WO 02/29928 | A2 | 4/2002 |
| WO | WO 2005/109571 | A1 | 11/2005 |

OTHER PUBLICATIONS

Volakis J L et al., "A Broadband Cavity-Backed Slot Spiral Antenna," IEEE Antennas and Propagation Magazine, vol. 43, No. 6, Dec. 1, 2001, pp. 15-26.

International Preliminary Report on Patentability, PCT/EP2008/010757, Oct. 14, 2010, pp. 1-9.

* cited by examiner

ANTENNA COUPLER

CROSS-REFERENCE TO RELATED APPLICATION

The present application is a national phase application of PCT Application No. PCT/EP2008/010757, filed on Dec. 17, 2008, and claims priority to European Patent Application No. 07 024 557.6, filed on Dec. 18, 2007, and European Patent Application No. 08 008 065.8, filed on Apr. 25, 2008, the entire contents of which are herein incorporated by reference.

BACKGROUND OF THE INVENTION

1. Field of the Invention

The invention relates to an antenna coupler for testing a mobile-radio device.

2. Discussion of the Background

For the testing of mobile-radio devices, it was formerly conventional to provide a separate connection to the mobile-radio device, by means of which the mobile-radio device is connected to test device. However, this has the disadvantage, that only a part of the hardware of the mobile-radio device is used in the test. Accordingly, the transmission of the signals is not implemented, for example, via the radio interface, but via a cable-bound connection. Antenna couplers were developed to remedy this disadvantage. The antenna couplers use a capacitive or inductive coupling in order to transmit signals between the mobile-radio device and the test device connected to the antenna coupler for the implementation of the test. One problem in this context is that different mobile-radio devices operate in different frequency ranges. This generally requires the arrangement of several antennas within the coupler, wherein an accurate positioning of the mobile-radio device relative to the respective antennas must be implemented because of the selective behaviour of the antennas. To resolve this problem, the use of a spiral-shaped, structurally flat antenna is known from DE 10 2004 033 383 A1. This has improved coupling properties and can, in particular, be used in a broadband manner. The spiral-shaped antenna structure can be provided, for example, by strip conductors formed on a printed-circuit board. With the proposed spiral antenna for an antenna coupler, it is problematic that, with conventional antennas, within the near field, a strong interaction occurs between the radiating element, that is, the spiral antenna, and the metallic, radiating antenna part in the mobile-radio device.

SUMMARY OF THE INVENTION

Accordingly, embodiments of the present invention advantageously provide an antenna coupler, which can be used in a broadband manner and with which the influence on performance of metallic objects in the near field is as low as possible.

The antenna coupler according to the invention for testing a mobile-radio device provides a coupling element formed in flat shape by means of strip conductors on a printed-circuit board. On a first side of the printed-circuit board, a retaining device is provided for the positioning of a mobile-radio device in the direct vicinity of the coupling element. On the first side of the printed-circuit board, at least one slit structure is introduced into an ground metallization formed there. A strip conductor formed on the second side of the printed-circuit board facing away from the ground metallization serves to feed the slit structure acting as the coupling element.

This strip conductor forms a microstripline with the remaining parts of the ground metallization formed on the first side.

The use of an antenna structure provided on the printed-circuit board and acting in a broadband manner, of which the coupling element formed in a flat shape is provided as a slit structure, means that only one antenna must be fitted, in order to cover the conventional mobile-radio frequencies. The influence, which, with conventional antennas, which allow such a broadband application, is present because of the metallic objects, for example, within the mobile-radio device, is suppressed in this context through the use of a slit structure. The use of such a slit structure is advantageous, particularly because the conventional approximations in the consideration of antennas in view of the interaction in the close-field range do not apply.

A formation of the slit structure in a spiral shape is particularly preferred. With a spiral-shaped slit structure of this kind, an excellent coupling result can be achieved within the generally very limited geometric dimensions, which the antenna coupler may provide. Through the slit-like and spirally wound coupling structure, an excellent coupling factor is achieved, without the performance of the overall antenna coupler being impaired by the interaction with the metallic objects, as already explained.

It has proved particularly appropriate, if, starting from a feeder point forming the center of the spiral of the at least single-armed, spiral-slit antenna, an archimedean spiral is formed, which merges into a logarithmic spiral in a region further removed from the feeder point. Such an arrangement has proved particularly suitable for the formation of a coupling device for mobile-radio devices operating in a broadband manner.

The end remote from the feeding point of every slit arm with a spiral-shaped structure is preferably terminated by a plurality of resistors arranged in succession. These are arranged, preferably using SMD technology, in such a manner that they span across the slit of the slit structure. Accordingly, an impedance-corrected termination of the respective slit structures can be achieved, wherein the necessary space requirement is very low.

As an alternative to the spiral-shaped embodiment, a so-called logarithmic-periodic slit antenna can also be provided as the coupling element. In this context, a plurality of straight slit elements arranged in a parallel manner, of which the length increases with an increasing distance from a feeder point, is formed on the first side of the printed-circuit board by interrupting the ground metallizations formed there. The individual slit elements are connected to one another at one end, wherein the common slit component formed in this manner stands perpendicular to the direction of extension of the slit elements. Such an arrangement has the advantage that a reflector used to improve the properties of the coupling structure can be formed in a particularly simple shape.

The slit width of the slit arms in the case of a spiral slit structure, or respectively the slit width of the slit elements and of a common slit part in the case of a logarithmic-periodic slit structure, increases, according to one preferred embodiment, with an increasing distance from the feeder point. According to another embodiment, the provision of a uniform slit width over the entire frequency range, in which the antenna structure is used as a coupling element, is particularly advantageous with spiral-shaped slit structures.

The coupling properties can be further improved, if the slit structures are formed in a meandering manner. The meandering geometry in this context can provide, for example, a rectangular structure, a triangular structure or a sinusoidal course. While the overall geometry is spiral-shaped or also logarithmic-periodic, the individual slit arms or respectively slit elements follow this basic shape in a meandering manner.

A reflector is preferably formed on the second side of the printed-circuit board. With a spiral slit structure, the latter is formed in a truncated-conical shape; by contrast, with a logarithmic-periodic coupling-element geometry, it is formed as a prism. In this context, forming the reflector as a housing part of the antenna coupler is particularly preferred. The housing is then preferably formed as a box-shaped, enclosed housing, wherein a cover element is designed in a folding manner. The lower part serves to accommodate the printed-circuit board of the antenna coupler, wherein the base of the lower part is then preferably formed as the reflector. The intermediate space between the reflector and the slit structure as the coupling element can be filled with a dielectric material in order to achieve particularly good measured values. By particular preference, this dielectric material can be formed in such a manner that it serves to fix the printed-circuit board together with the structures formed there.

A formation of the antenna coupler with a flat reflector is particularly preferred. This flat reflector is then disposed on the second side of the printed-circuit board. An absorber material is disposed on the side of the reflector facing towards the printed-circuit board. In view of the flat arrangement, the entire structural space of the antenna coupler can be reduced. For applications in the field of mobile-radio technology, a spacing distance between the printed-circuit board and the reflector of approximately 16 millimeters is preferably provided.

It is particularly advantageous to provide an absorber material on the reflector, of which the maximum thickness is one third of the spacing distance between the reflector and the printed-circuit board. By particular preference, with a spacing distance between the reflector and the printed-circuit board of 16 millimeters, a thickness of the absorber material of 5 millimeters is provided. The absorber material here is especially a carbon-filled absorber foam. This arrangement has the advantage that a low ripple occurs as a result of the attenuated reflections.

BRIEF DESCRIPTION OF THE DRAWINGS

The drawings present examples of the antenna coupler according to the invention, which are explained in greater detail in the description below. The drawings are as follows.

DETAILED DESCRIPTION OF EXEMPLARY EMBODIMENTS OF THE INVENTION

Figure 1:
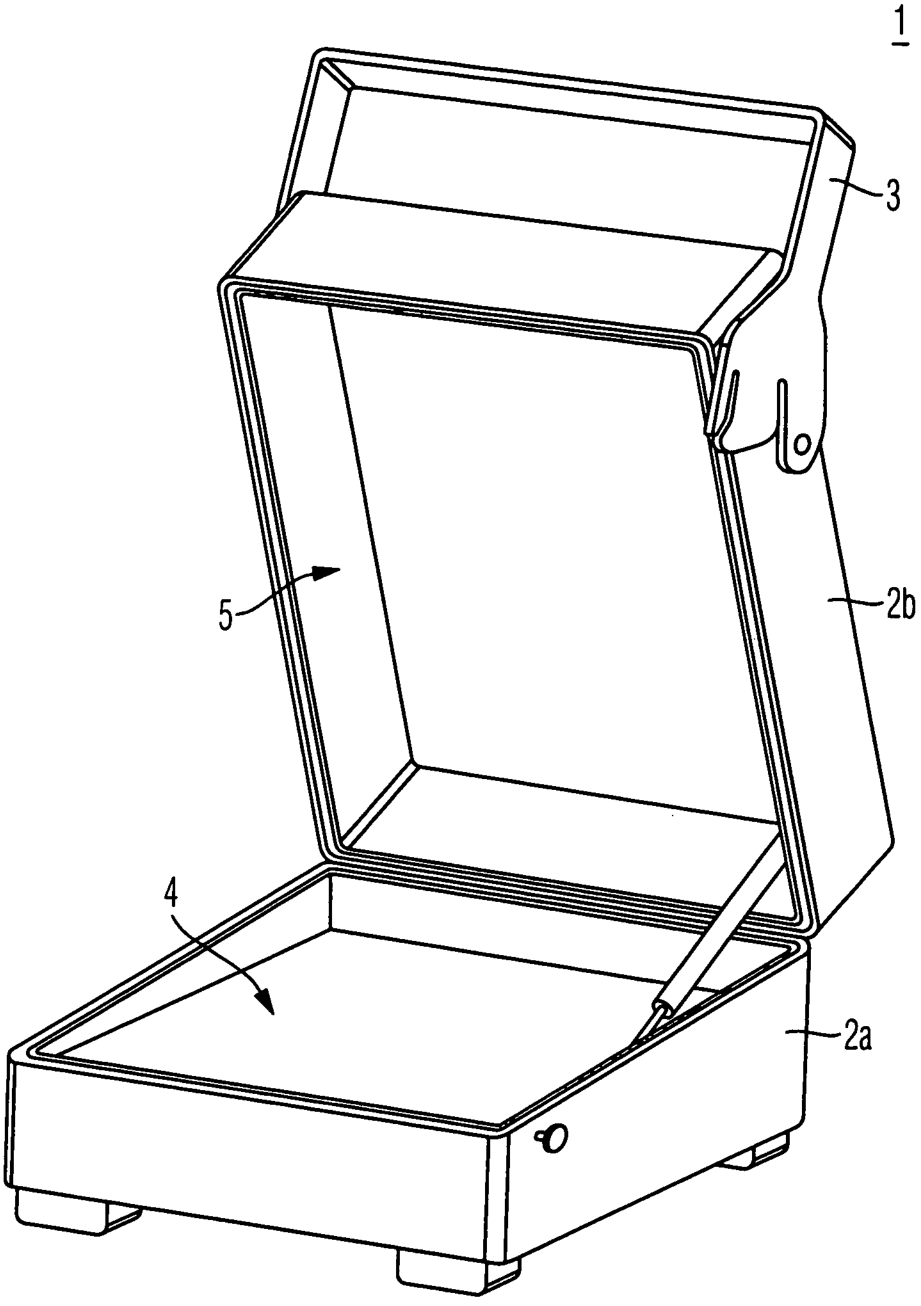
FIG. 1 shows a perspective view of an open housing of an antenna coupler according to the invention.

FIG. 1 shows a housing 1 of an antenna coupler. The housing 1 provides a lower part 2*a* and a cover part 2*b*. The lower part 2*a* and the cover part 2*b* are connected to one another in an articulated manner. The lower part 2*a* is open at one side and surrounds a first volume 4. At least the printed-circuit board, on which the coupling structures are formed, is inserted into this first volume 4, in which only a flat board is inserted in FIG. 1.

A second volume is similarly formed in the cover part 2*b*. This second volume 5 is empty in the illustrated embodiment of the housing 1. However, it is equally conceivable that the second volume 5 is filled with an absorber material. For example, pyramidal structures can be formed in an absorbing material, wherein the entire absorber element is attached to the cover part 2*b*. Furthermore, a closing mechanism 3 is formed on the cover part 2*b*. In the illustrated exemplary embodiment, this is rotatable and engages in a locking projection on the lower part 2*a*. When the cover part 2*b* is closed, the housing 1 forms a high-frequency-sealed, enclosed unit, so that a test of a mobile-radio device disposed within it cannot be disturbed by external sources of interference.

Figure 2A:
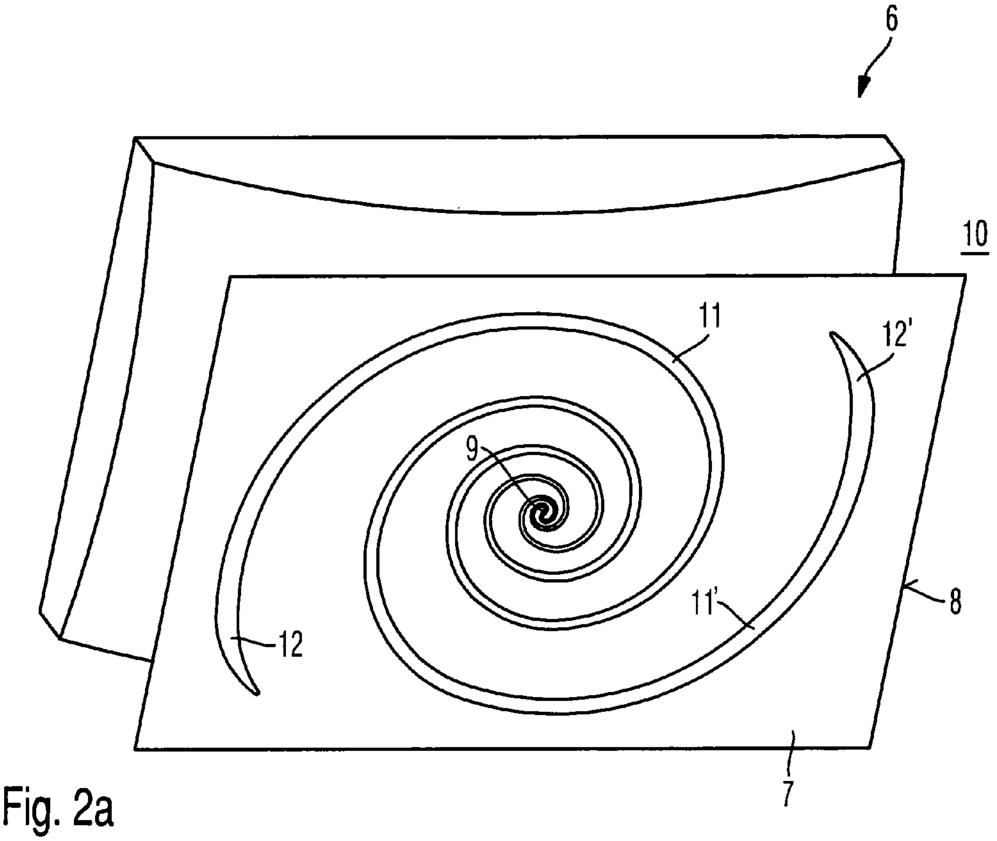
FIG. 2*a* shows an antenna coupler with a spiral-shaped slit geometry and a reflector.

FIG. 2*a* presents a first exemplary embodiment of an antenna coupler 10 according to the invention. The antenna coupler 10 comprises a printed-circuit board 8. An ground metallization 7 is attached to a first side of the printed-circuit board 8, which is orientated during installation into the housing 1 in the direction towards the cover part 2*b*. A slit structure is introduced into the ground metallization 7. In the illustrated exemplary embodiment, the slit structure is formed in a spiral shape and provides a first slit arm 11 and a second slit arm 11'. The two slit arms 11, 11' merge into one another at a feeder point 9. With an increasing distance from the feeder point 9, the width of the slit arm 11 and of the slit arm 11' increases. The ends of the slit arms 11, 11' remote from the feeder point 9 are still disposed completely within the ground metallization 7. In order to achieve a termination of the slit arms 11, 11' suitable for the implementation of the measurement, each slit arm 11, 11' tapers respectively in an end region 12, 12'.

The formation of the slit structure in the ground metallization 7 can be implemented in a conventional manner, for example, by etching.

A reflector 6 is disposed on the side of the printed-circuit board 8 facing away from the ground metallization 7. Through the reflector 6, a metallic element, the electromagnetic fields are superimposed in a positive manner on the first side of the printed-circuit board 8 facing towards the mobile-radio device to be tested.

Figure 2B:
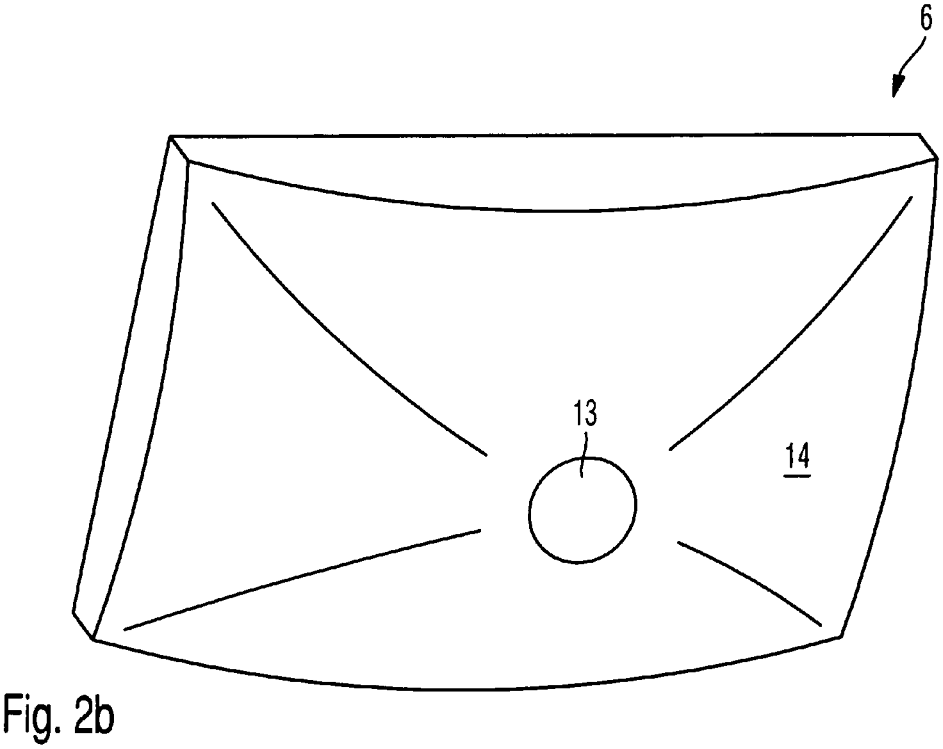
FIG. 2*b* shows a truncated-conical reflector for spiral-slit structures.

Dependent upon the frequency, a so-called active zone of the slit structure is obtained in each case as the coupling element. The active zone is substantially a circular ring, the center point of which coincides with the feeder point 9. With increasing frequency, the average diameter of the circular ring is reduced. Since the spacing distance of the reflector 6 from the second side of the printed-circuit board 8 is dependent upon the wavelength, a truncated-conical geometry of the reflector 6 is obtained taking into consideration an upper threshold frequency. A truncated-conical geometry of this kind is illustrated in FIG. 2*b* in a three-dimensional view. The reflector 6 comprises the circular segment 3 and the conical surface area 14. In this context, the distance of the circular segment 13 from the feeder point 9 is determined by the upper threshold frequency.

Since the slit structures also provide conductive properties, and accordingly, electromagnetic waves are guided through the slits, there is a coupling mechanism across near fields and scattered fields. Accordingly, a coupling can also occur below a theoretical, lower threshold frequency of the structure.

Figure 3A:
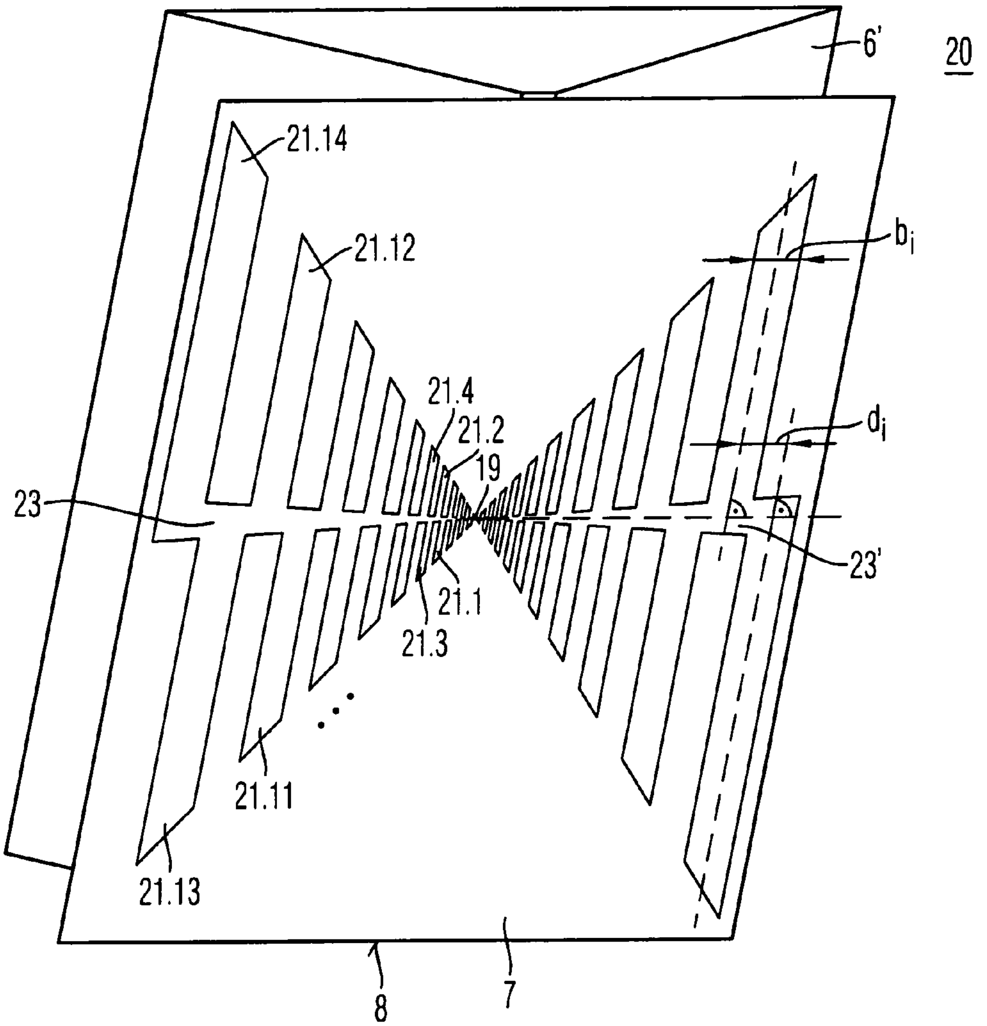
FIG. 3*a* shows a logarithmic-periodic structure as a coupling element with a correspondingly formed reflector.
Figure 3B:
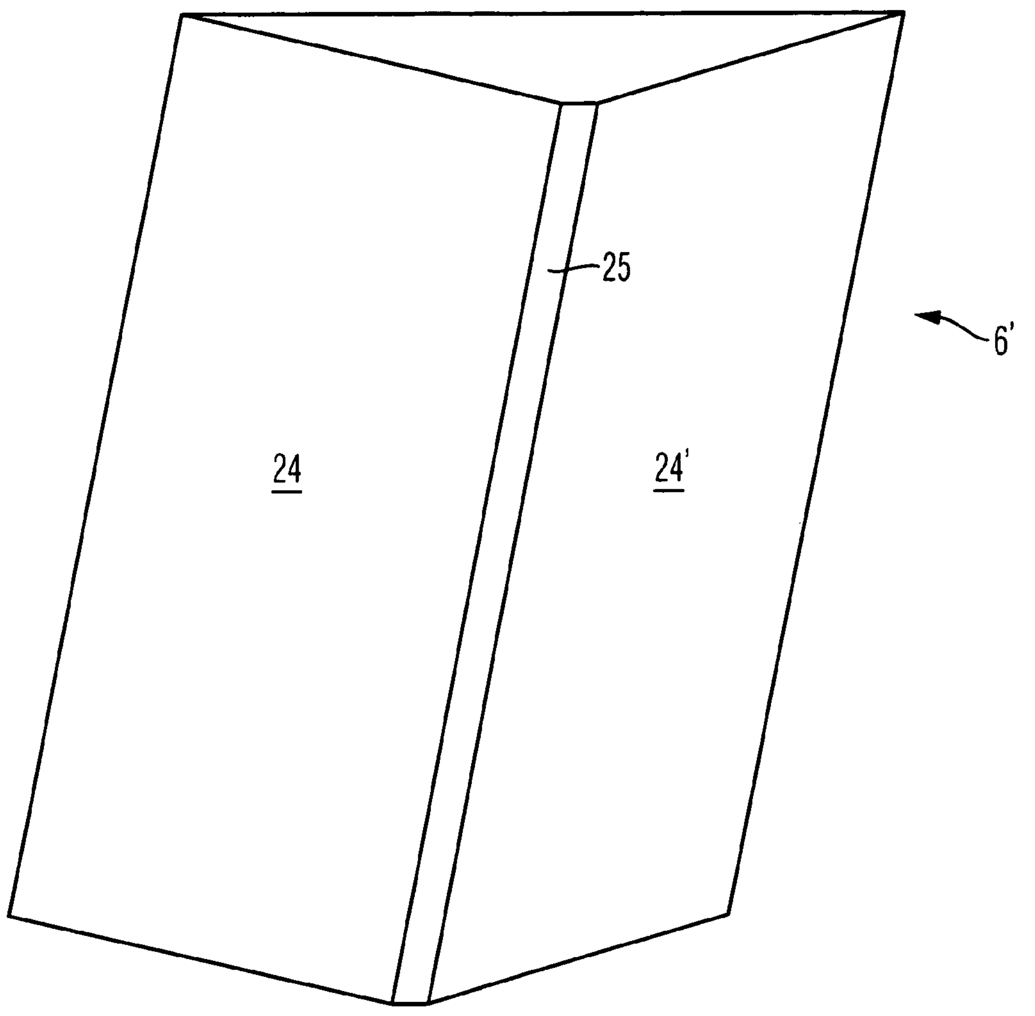
FIG. 3*b* shows a three-dimensional view of a reflector for a logarithmic-periodic slit structure.

A further example of an antenna coupler 20 and the formation of a slit structure as the coupling element together with the associated reflector for the improvement of the antenna gain is shown in FIGS. 3*a* and 3*b*. FIG. 3*a* shows a so-called logarithmic-periodic structure. In this context, slit elements 21.1, . . . 21.14 are arranged parallel to one another in each case. The spacing distance $d_i$ between the centers of two adjacent slit elements 21.*i* therefore increases with an increasing distance from the feeder point 19. At the same time, the slit width $b_i$ is also enlarged. Both the spacing distance $d_i$ and also the slit width $b_i$ are enlarged in this context with the logarithm of the distance from the feeder point 19. The slit elements 21.*i* are connected to one another via a common slit part 23. The slit elements 21.*i* extend in an alternating manner from this common slit part 23 in each case in the opposite direction. The common slit part 23 and the direction of extension of the individual slit elements 21.*i* are disposed perpendicular to one another, wherein the common slit part 23 passes through the feeder point 19. The alternating arrangement of the slit elements 21.*i* is selected in such a manner that overall, a point-symmetrical geometry relative to the feeder point 19 is obtained. To allow improved visibility, the reference numbers have been shown only for some of the slit elements 21.*i*.

In each case, the end of a slit element 21.*i* facing away from the common slit part 23 is formed in such a manner that the ends of the slit elements 21.*i*, which extend to one side of the common slit part 23, are disposed on a common, straight line passing through the feeder point 19. This applies in the same manner for the slit elements 21.*i* extending on the other side of the common slit part 23. The outer limit of the resulting, overall slit structure is therefore approximately identical to a section through a double cone. The active zone is formed in each case by those slit elements 21.*i*, of which the length is approximately $\lambda/4$ or somewhat shorter.

Because of the resulting symmetry, the reflector 6' is now no longer formed as a truncated cone, but as a straight prism, with an equal-sided trapezium as the base surface. In this manner, a reflector segment 25 is once again obtained, which is arranged, dependent upon the upper threshold frequency, at a given spacing distance from the second side of the printed-circuit board 8, on which the logarithmic-periodic slit structure is formed. On both sides of the latter, a first reflector surface 24 or respectively a second reflector surface 24' is formed, the spacing distance of which from the second side of the printed-circuit board 8 increases with an increasing spacing distance from the reflector segment 25.

It is particularly preferred, if the reflector 6 or respectively 6' is formed by the base of the lower part 2*a* of the housing 1. An additional structural component can be saved as a result.

Figure 4:
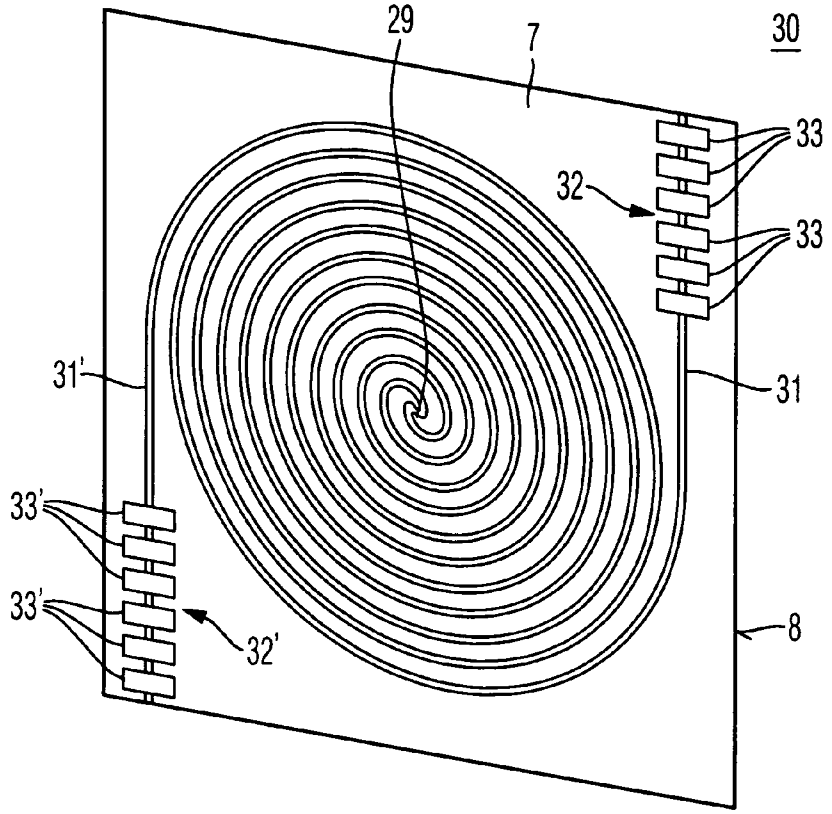
FIG. 4 shows a two-armed, archimedean spiral as the slit structure.
Figure 5:
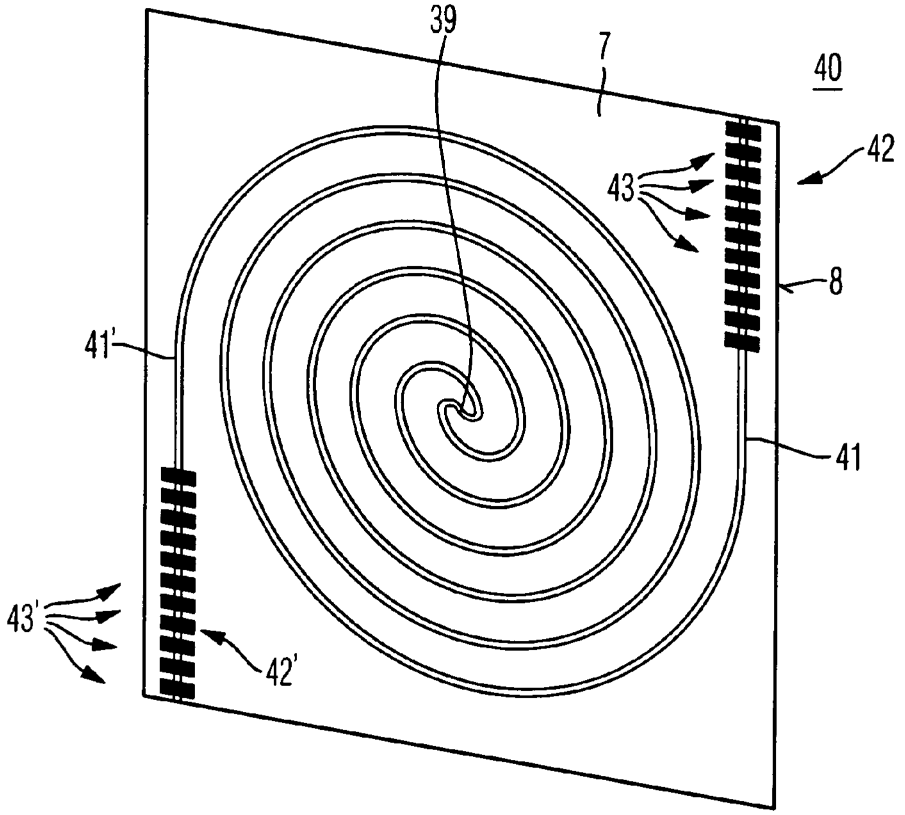
FIG. 5 shows a further example of two-armed, archimedean spiral.

FIG. 4 shows a further example of a spiral-shaped slit structure. The antenna coupler 30 formed in this manner is once again provided by the two-armed, spiral slit structure with a first slit arm 31 and a second slit arm 31'. The two slit arms 31 and 31' each provide a slit end or respectively 32' extending in a tangential direction. The overall structure is symmetrical relative to the feeder point 29 of the antenna coupler 30. A sequence of several resistors 33 and respectively 33' arranged in succession is provided in each end region 32, 32'. The resistors connect the ground metallization portions remaining at both sides of each slit arm 31, 31'. The termination of a slit arm, formed, for example, with a surge impedance of 100 ohms, can be varied over a wide range through the selection of the resistors 33 and respectively 33' preferably attached using SMD technology. With a tightly wound spiral formed as an archimedean spiral as shown in FIG. 4, the structure achieved is particularly insensitive to positional uncertainties in the positioning of the mobile-radio device. By contrast with this, the archimedean spiral shown in FIG. 5 provides a looser winding. Here also, the spiral is designed with two arms with a first slit arm 41 and a second slit arm 41'. The respective end regions 42, 42' are also terminated via a row of SMD resistors 43, 43'. In addition to the use of resistors, the slit width of the otherwise uniformly wide slit arms 41, 41' can taper in the direction towards the end facing away from the feeder point 39.

Figure 6:
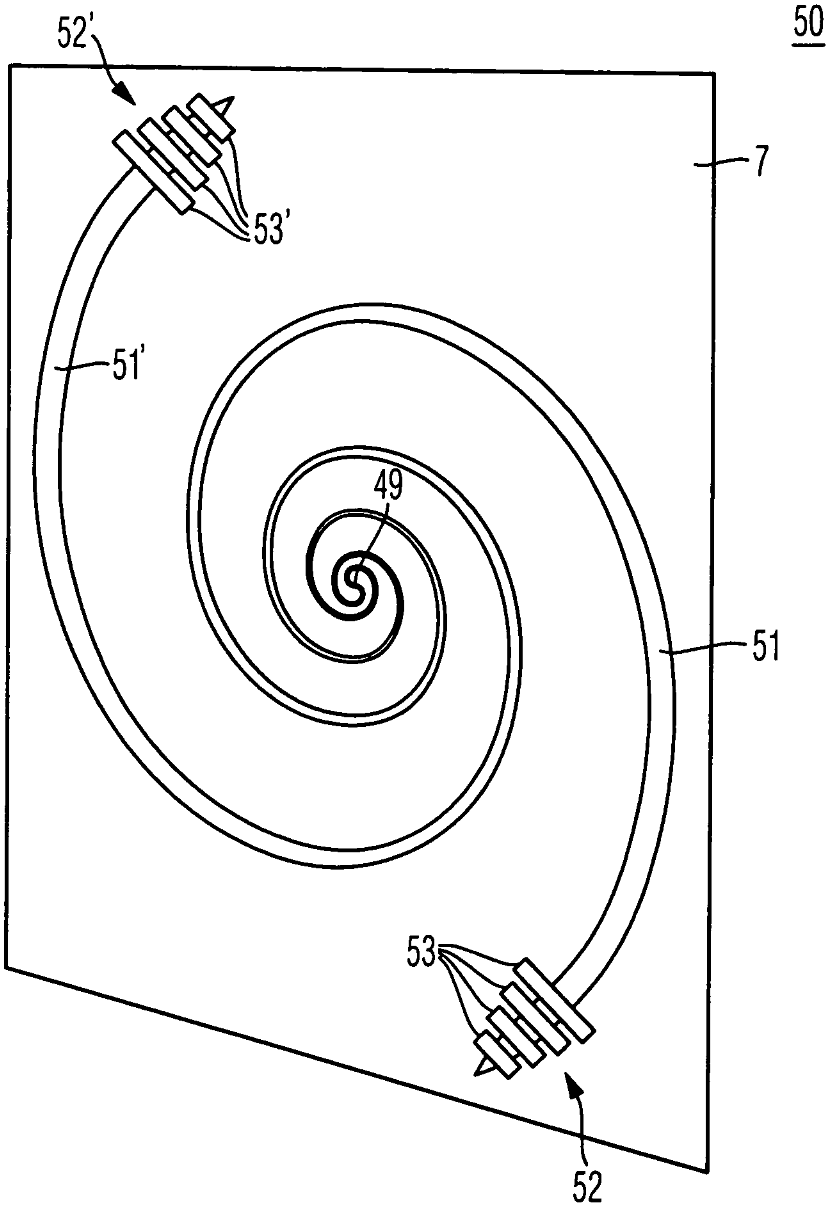
FIG. 6 shows a two-armed, logarithmic spiral with widening slit arms.

FIG. 6 illustrates a logarithmically wound spiral. The spiral-shaped slit structure once again provides a first slit arm 51 and a second slit arm 51', which form the antenna coupler 50. Starting from the feeder point 49, the geometry of the logarithmic spiral is preserved up to the region of the ends 52, 52' of the first slit arm 51 and of the second slit arm 51'. Accordingly, by contrast with the preceding examples from FIGS. 4 and 5, the slit ends 52 and 52' do not differ from the geometry of the slit arms 51, 51' towards the feeder point 49. The end regions 52, 52' then taper, as already explained. Once again, several resistors 53 or respectively 53' arranged in succession are provided in the tapering region for the termination of the slit arms 51, 51'. The surge impedance of a slit arm is preferably 100 ohms, as with the other examples.

Figure 7:
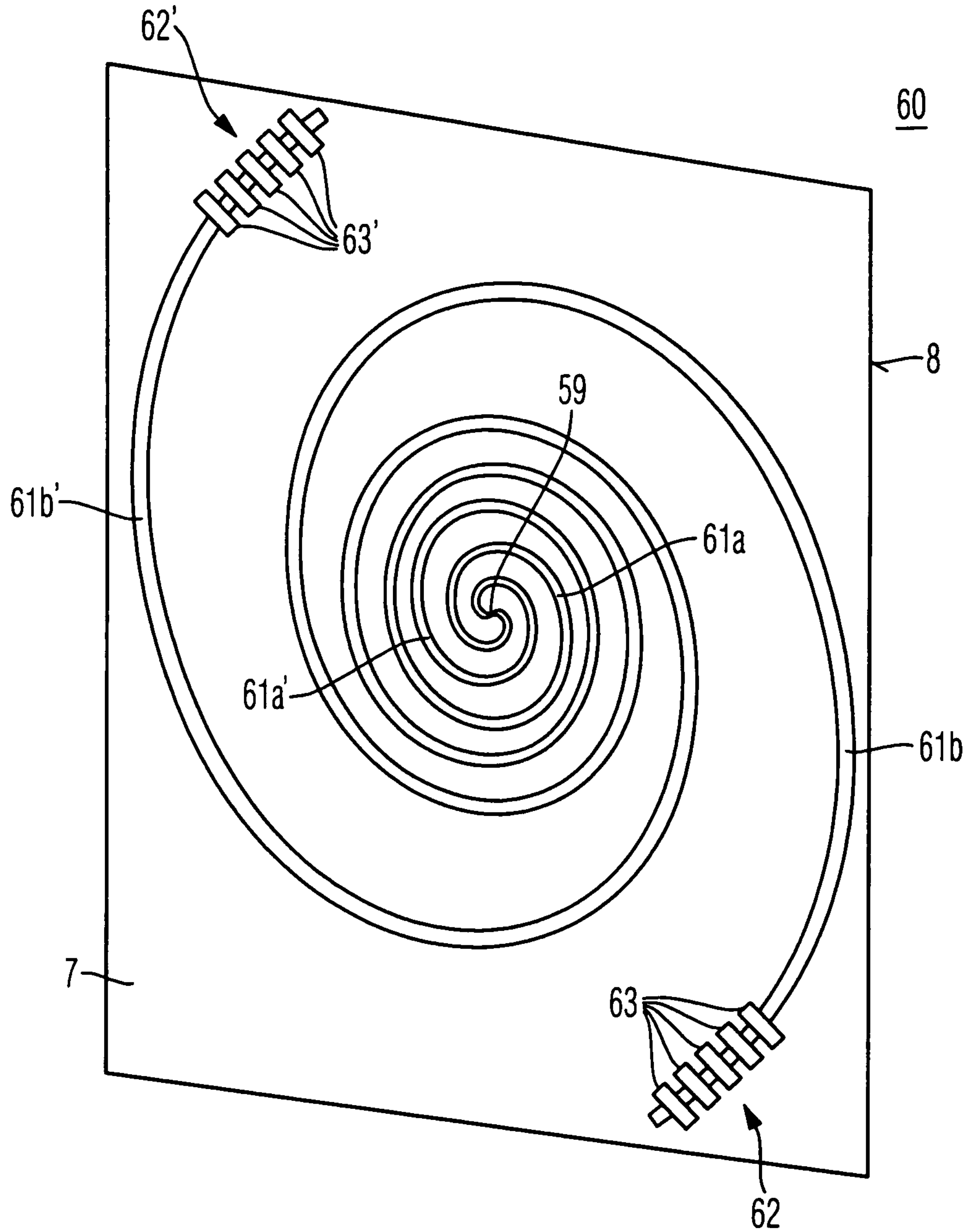
FIG. 7 shows an archimedean spiral in the inner region and logarithmic, two-armed spirals in the outer region with a constant slit-arm width.

A further exemplary embodiment of a slit structure is illustrated in FIG. 7. The antenna coupler 60 illustrated there once again provides a two-armed spiral. An archimedean spiral is initially formed starting from the feeder point 59 of the antenna coupler 60. With an increasing distance from the feeder point 59, the archimedean spiral merges into a logarithmic spiral. Instead of the initially equidistant slit-arm parts of each first region 61*a*, 61'*a*, the spiral widens in second slit-arm parts in the second regions 61*b* and respectively 61'*b* of the first slit arm 61 and respectively of the second slit arm 61'.

As with the logarithmic spiral of FIG. 6, the termination is provided in the form of several resistors arranged in succession in the respective end region 62, 62' of the slit arms 61, 61'. By contrast with the spiral of FIG. 6, in which the width of the slit arms 51, 51' increases with increasing distance from the feeder point 49, the slit width of the first slit arm 61 and of the second slit arm 61' in the exemplary embodiment of FIG. 7 is constant.

Figure 8:
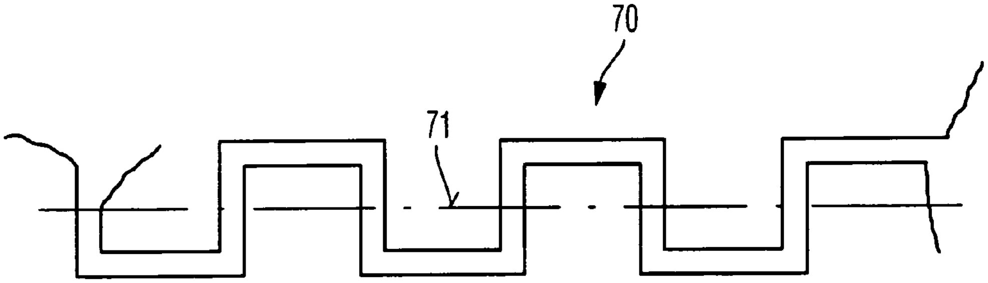
FIG. 8 shows an example by way of explanation of meandering slit geometries.

The preceding examples each show slit elements or slit arms, in which the formation of the edge of the ground metallization forming a slit is substantially rectilinear, or extends in a curved manner corresponding to the course of the spiral. By contrast, in FIG. 8, a meandering structure is shown. The substantial extent of slits, which corresponds either to the direction of the slit elements 21.*i* or of the slit arms in the case of spiral slit structures, is shown by the dotted and dashed line 71 in FIG. 8. However, the edges of the slits do not now extend parallel to the substantial direction of the slit arms or respectively slit elements, that is to say, of the dotted and dashed line 71. On the contrary, a regular, meandering structure 70 is formed. With a meandering structure 70 of the slits of this kind, the lower threshold frequency can once again be reduced. In particular, the overall dimensions of the coupling structure and accordingly of the antenna coupler can be reduced. In FIG. 8, a rectangular meander is shown. However, triangular or continuous forms can also be used equally well. For example, a sinusoidal form is conceivable.

The meandering structure 70 is provided especially at the run-out of the slit arms. Accordingly, as is the case in FIGS. 4 and 5, the respective slit arm 41, 41' or 31, 31' can run out in a tangential manner. Accordingly, a portion running in a straight line arises especially between the spiral-shaped portion and the slit end 32, 32', or respectively 42, 42', in which resistors 33, 33 or respectively 43, 43' are arranged for the termination of the slit arms 31, 31' or respectively 41, 41'. This portion running in a straight line is preferably used for the formation of the meandering structure 70. A part running tangentially in this manner can also be provided in the case of the examples of FIGS. 6 and 7. In this case also, the meandering structure 70 is formed in the straight part of the slit arms.

Figure 9:
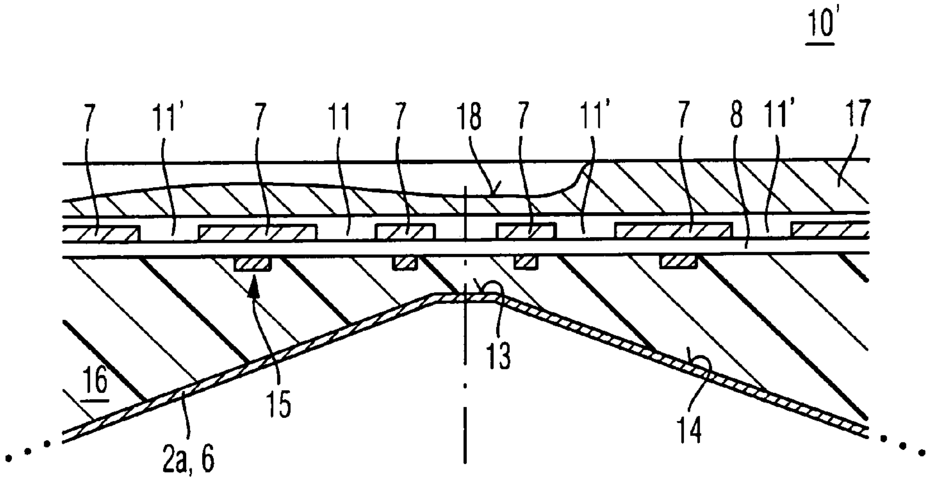
FIG. 9 shows a partial section through an antenna coupler disposed in the housing of FIG. 1.

Finally, FIG. 9 shows a section through an antenna coupler with the geometries described above, when it is inserted in a housing according to FIG. 1. It is evident that the reflector 6 is formed by a part of the lower part 2*a* of the housing. The printed-circuit board 8 is disposed at a spacing distance from the latter. The ground metallization 7 is disposed on the printed-circuit board 8. In the exemplary embodiment presented, the ground metallization 7 is covered by a covering element 17. This covering element comprises a dielectric material and is used for retaining and positioning a mobile-radio device to be tested. For this purpose, a recess 18 is provided, which can be adapted to the geometry of the mobile-radio device to be tested in each case. Of course, a separate holder or merely a positioning aid can also be provided. Furthermore, it is evident that a strip conductor 15 is formed on the second side of the printed-circuit board 8 facing towards the reflector 6. Together with the ground metallization 7 remaining between the slits 11, 11', this forms a so-called microstripline. The strip conductor 15 is used for feeding the coupling structure and accordingly leads to the feeder point 9 disposed in the middle. A corresponding strip line is of course also present in the case of the logarithmic-periodic structure of FIG. 3*a*.

Moreover, FIG. 9 shows the preferred embodiment, in which the intermediate space remaining between the reflector 6 and the printed-circuit board 8 is filled with a dielectric material 16. In particular, the dielectric filling 16 and the printed-circuit board 8 can be connected to one another in such a manner that they can be inserted as a one-piece device into the lower part 2*a* of the housing 1.

Figure 10:
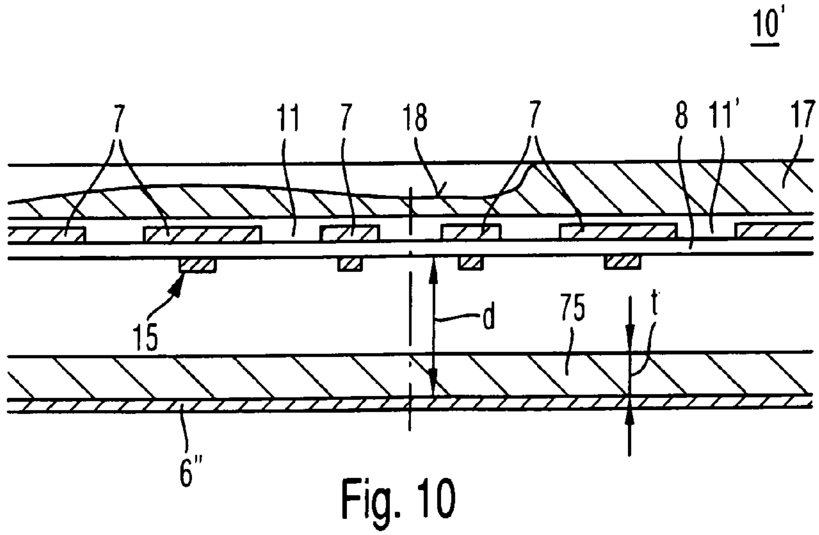
FIG. 10 shows a partial section through an antenna coupler with the flat reflector arranged in the housing of FIG. 1.

FIG. 10 shows a further example of a section through an antenna coupler. In this context, a flat reflector 6" is formed at a spacing distance d from the printed-circuit board 8. The flat reflector 6" can, once again, be realized by the housing base. An absorber material 75 is disposed on the surface of the flat reflector 6" facing towards the printed-circuit board 8. The absorber material 75 can be, for example, a carbon-filled absorber foam. The thickness t of the absorber material 75 is preferably somewhat less than ⅓ of the spacing distance d. In one particularly preferred exemplary embodiment, especially with an absorber material 75 as a carbon-filled absorber foam, the spacing distance d is 16 millimeters and the thickness t of the absorber material is 5 millimeters.

Figure 11:
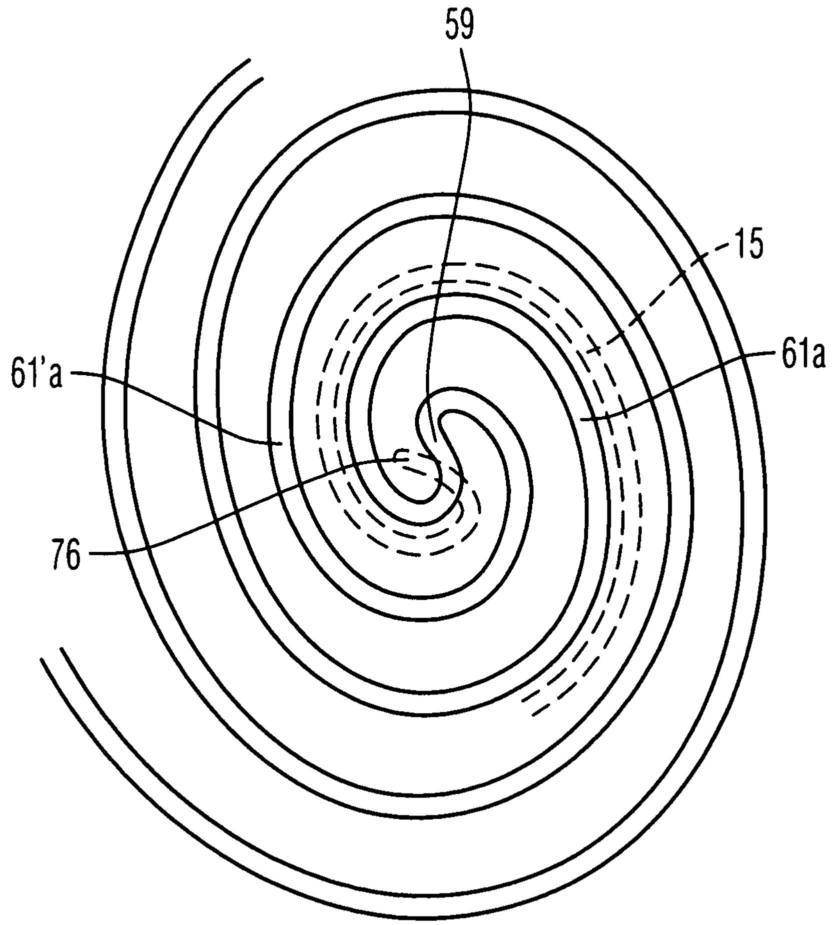
FIG. 11 shows a detail view of the center of the logarithmic, two-armed spiral of FIG. 7 by way of illustration of the center of excitation.

The center of the antenna coupler of FIG. 7 is presented once again in an enlarged scale in FIG. 11. In this context, the strip conductor 15, which is disposed on the other side of the printed-circuit board 8, is shown as a dotted line between the two slit arms 61*a*, 61'*a*. In the region of the feeder point 59, the latter crosses the slit structure formed on the first side of the printed-circuit board. At its end, it is connected via a through contact 76 to the ground metallization 7 formed between the slit structure.

The small spacing distance between the flat reflector 6" and the printed-circuit board 8 not only leads to a smaller total structural volume of the antenna coupler, but, beyond this, also offers other advantages in manufacture. The material removal cost for the housing of the antenna coupler is considerably reduced as a result.

The invention is not restricted to the exemplary embodiment presented. In particular, individual features of different exemplary embodiments can also be combined with one another in an advantageous manner. Accordingly, especially the truncated-conical reflector 6 can be combined with all of the spiral-shaped slit structures. Moreover, single-armed or multiple-armed spirals can be used instead of the illustrated two-armed spirals.

Moreover, to improve the termination of the slit elements or respectively slit arms, the respective ends of the slits can be provided with a herring-bone structure. The antenna coupler is provided especially for coupling in the near field with a spacing distance of up to one wavelength.

The invention claimed is:

1. An antenna coupler for testing a mobile-radio device, comprising:
- a printed-circuit board;
- a ground metallization formed on a first side of the printed-circuit board;
- a coupling element formed in a flat manner by strip conductors on the printed-circuit board; and
- a retaining device formed on the first side of the printed-circuit board for positioning the mobile-radio device in a vicinity of the coupling element,
- wherein, on the first side of the printed-circuit board at least one spiral-shaped slit structure is introduced into the ground metallization,
- wherein, for feeding the slit structure serving as the coupling element, at least one stripline is formed on a second side of the printed-circuit board facing away from the first side, the at least one stripline forming a microstripline with the ground metallization that remains between the slit structure of the first side, and
- wherein, a reflector, formed in a shape of a truncated cone, is provided on the second side of the printed-circuit board.

2. The antenna coupler according to claim 1,
- wherein the spiral-shaped slit structure is formed in the region around a feeder point initially by at least one slit-arm portion, which describes an archimedean spiral, wherein the at least one slit-arm portion merges in a region further removed from the feeder point into a second slit-arm portion, which describes a logarithmic spiral.

3. The antenna coupler according to claim 1,
- wherein an end of a slit arm facing in each case away from the feeder point is terminated by several resistors arranged in succession in the direction of the slit.

4. The antenna coupler according to claim 3,
- wherein the slit width of the slit arms is constant.

5. The antenna coupler according to claim 1,
- wherein the slit structures are limited at least partially by meandering slit edges.

6. The antenna coupler according to claim 1,
- wherein the first side of the printed-circuit board is covered by a dielectric material, and the retaining device is formed on the side of the dielectric material facing away from the first side.

7. The antenna coupler according to claim 1, wherein the reflector is formed by a housing part of the antenna coupler.

8. The antenna coupler according to claim 1, wherein the intermediate space between a reflector and the slit structure is filled with a dielectric material.

9. The antenna coupler according to claim 2, wherein an end of a slit arm facing in each case away from the feeder point is terminated by several resistors arranged in succession in the direction of the slit.

10. The antenna coupler according to claim 1, wherein the slit structures are limited at least partially by meandering slit edges.

11. The antenna coupler according to claim 1, wherein the first side of the printed-circuit board is covered by a dielectric material, and the retaining device is formed on the side of the dielectric material facing away from the first side.

12. The antenna coupler according to claim 1, wherein the intermediate space between a reflector and the slit structure is filled with a dielectric material.

13. An antenna coupler for testing a mobile-radio device comprising:

a printed-circuit board;

a ground metallization formed on a first side of the printed-circuit board;

a coupling element formed in a flat manner by strip conductors on the printed-circuit board; and a retaining device formed on the first side of the printed-circuit board for positioning the mobile-radio device in a vicinity of the coupling element, wherein, on the first side of the printed-circuit board at least one slit structure is introduced into the ground metallization, wherein, for feeding the slit structure serving as the coupling element, at least one stripline is formed on a second side of the printed-circuit board facing away from the first side, the at least one stripline forming a microstripline with the ground metallization that remains between the slit structure of the first side, and wherein a flat reflector, having an absorber material disposed on a side thereof facing towards the printed-circuit board, is formed on the second side of the printed-circuit board.

14. The antenna coupler according to claim 13, wherein a maximum thickness of the absorber material is up to ⅓ of a spacing distance of the reflector from the printed-circuit board.

* * * * *